United States Patent
Tricas et al.

(10) Patent No.: US 12,507,501 B2
(45) Date of Patent: Dec. 23, 2025

(54) OPTICALLY TRANSPARENT ELECTROMAGNETIC SHIELDING ASSEMBLY PROVIDING EFFICIENT PROTECTION AGAINST MICROWAVE RADIATIONS

(71) Applicants: SAFRAN ELECTRONICS & DEFENSE, Paris (FR); UNIVERSITE DE RENNES 1, Rennes (FR); CENTRE NATIONAL DE LA RECHERCHE SCIENTIFIQUE - CNRS, Paris (FR)

(72) Inventors: Quentin Tricas, Paris (FR); Patrice Foutrel, Paris (FR); Philippe Besnier, Paris (FR); Xavier Castel, Rennes (FR); Claire Le Paven, Rennes (FR)

(73) Assignees: SAFRAN ELECTRONICS & DEFENSE, Paris (FR); UNIVERSITE DE RENNES 1, Rennes (FR); CENTRE NATIONAL DE LA RECHERCHE SCIENTIFIQUE—CNRS, Paris (FR)

( * ) Notice: Subject to any disclaimer, the term of this patent is extended or adjusted under 35 U.S.C. 154(b) by 427 days.

(21) Appl. No.: 18/006,007

(22) PCT Filed: Jul. 8, 2021

(86) PCT No.: PCT/FR2021/051264
§ 371 (c)(1),
(2) Date: Jan. 19, 2023

(87) PCT Pub. No.: WO2022/018346
PCT Pub. Date: Jan. 27, 2022

(65) Prior Publication Data
US 2023/0299214 A1    Sep. 21, 2023

(30) Foreign Application Priority Data

Jul. 22, 2020   (FR) .................................. 2007712

(51) Int. Cl.
*H10F 77/50*     (2025.01)
*H01L 23/552*    (2006.01)
*H01L 25/16*     (2023.01)

(52) U.S. Cl.
CPC ........... *H10F 77/50* (2025.01); *H01L 23/552* (2013.01); *H01L 25/167* (2013.01)

(58) Field of Classification Search
CPC ..... H01L 23/552; H01L 25/167; H10F 77/50; H05K 9/0084; H05K 9/0081; G01J 5/06; G01J 2005/065
(Continued)

(56) References Cited

U.S. PATENT DOCUMENTS

2011/0115686 A1    5/2011   Hauhe et al.
2013/0221219 A1*   8/2013   Torabi .................... G01J 5/046
                                                        250/214.1
(Continued)

FOREIGN PATENT DOCUMENTS

WO    2017207893 A1    12/2017
WO    2018215243 A1    11/2018

OTHER PUBLICATIONS

International Search Report mailed on Sep. 8, 2021, issued in the corresponding International Application No. PCT/FR2021/051077, filed on Jun. 15, 2021, 2 pages.
(Continued)

*Primary Examiner* — Didarul A Mazumder
(74) *Attorney, Agent, or Firm* — CHRISTENSEN O'CONNOR JOHNSON KINDNESS PLLC (57) ABSTRACT

An optically transparent electromagnetic shielding assembly exhibiting a shielding efficiency that is increased when a
(Continued)

conducting or polarizable fluid produces a low electrical impedance value between a periphery and a central region of a window. Such shielding assembly is useful in detection systems that are exposed to varying intensities of electromagnetic radiation, such as microwave radiation.

10 Claims, 7 Drawing Sheets

(58) Field of Classification Search
USPC .............................................. 257/99; 438/22
See application file for complete search history.

(56) References Cited

U.S. PATENT DOCUMENTS

| 2014/0146511 | A1 | 5/2014 | Czamy et al. |
| 2016/0293554 | A1* | 10/2016 | Tan ................... H01L 23/49838 |
| 2017/0237157 | A1 | 8/2017 | Urcia, Jr. et al. |
| 2020/0173859 | A1* | 6/2020 | Dupeyrat .............. H01L 23/552 |

OTHER PUBLICATIONS

International Written Opinion mailed on Sep. 8, 2021, issued in the corresponding International Application No. PCT/FR2021/051077, filed on Jun. 15, 2021, 2 pages.

* cited by examiner

OPTICALLY TRANSPARENT ELECTROMAGNETIC SHIELDING ASSEMBLY PROVIDING EFFICIENT PROTECTION AGAINST MICROWAVE RADIATIONS

CROSS-REFERENCES TO RELATED APPLICATIONS

This application is a National Stage of International Application No. PCT/FR2021/051264 filed Jul. 8, 2021, which claims priority to French Patent Application No. 2007712, filed Jul. 22, 2020, the entire disclosures of which are hereby incorporated by reference.

TECHNICAL FIELD

This description relates to an electromagnetic shielding assembly which is optically transparent.

PRIOR ART

Many applications use optical sensors, for example sensors sensitive to optical radiations which belong to the infrared range, but the operation of such sensors can be disrupted by electromagnetic radiations, in particular in the microwave range. Such microwave radiations can indeed interact with electronic circuits which need to be placed in the immediate vicinity of the sensors, without the possibility of moving them into volumes impermeable to the microwave radiations which originate from the outside. It is then known to arrange, in front of such optical sensor, a shielding element which is at least partially opaque to part of the microwave radiations while being at least partially transparent to the optical radiations. To achieve this, the shielding element generally comprises at least one two-dimensional structure which is electrically conducting in the microwave frequency range while being at least partially transparent to the optical radiations.

To provide efficient protection against the microwave radiations, the two-dimensional structure which is conducting in the microwave range must also be electrically connected to at least a portion of a shell which is also electrically conducting, and which surrounds the sensor(s) to be protected. This shell may itself be electrically connected to the electrical ground of a support or carrier vehicle on which the optical sensor(s) is (are) installed, or connected to a terminal of an electrical source. All of these connections must have low electrical impedance within the microwave range in order to provide the desired protection.

However, certain complex detection systems comprise, in addition to optical sensors, electromagnetic radiation sensors which are effective in the microwave frequency band, or close to this band in terms of frequency values. It is then necessary that the same shielding assembly which is used for all the sensors of the complex detection system achieves a trade-off between sufficient shielding efficiency and a level of transparency to microwave radiation, which allows the microwave radiation sensor(s) to operate. But there are conditions in which the microwave radiation that is likely to pass through the shielding element from outside varies in very significant proportions: between low intensity levels for which the shielding element must be sufficiently transparent to this microwave radiation, and very high intensity levels for which the shielding element must provide sufficient shielding efficiency. Such situation can occur in particular when the detection system approaches a source of microwave radiation, and the intensity of this microwave radiation received by the detection system increases during this approach. But the source may be analyzed by also using the sensors which are sensitive in the spectral domain of microwave radiation, in addition to optical sensors. To achieve this, the microwave radiation sensors require that the intensity of the microwave radiation used to analyze the source is sufficient, especially when the source is still at a distance from the detection system. Furthermore, the need for the shielding assembly to be sufficiently transparent to microwave radiation may also be required by the detection system itself, when it emits microwave radiation which is liable to disrupt its own operation if this radiation cannot propagate outwards. For these reasons, existing shielding assemblies are not well suited to such situations, especially those for which the intensity of the microwave radiation is highly variable during use or during a mission.

Technical Problem

An object of the invention is then to provide shielding assemblies which are suitable for uses or missions during which the microwave radiation has an intensity which varies greatly, but a portion of this microwave radiation may be useful.

SUMMARY OF THE INVENTION

To achieve this or other objects, a first aspect of the invention provides an optically transparent electromagnetic shielding assembly which comprises:
  a rigid substrate having two opposite faces, which is at least partially transparent between these two faces to at least one electromagnetic radiation of a frequency between 0.1 GHz (gigahertz) and 40 GHz, referred to as microwave radiation, and also at least partially transparent between the same two faces to an optical radiation which has a wavelength between 0.1 µm (micrometer) and 15 µm, this substrate further being electrically insulating; and
  an electrical contact area, which is located close to a periphery of the substrate, and which is intended to be electrically connected to a terminal of an electrical source or a terminal of an electrical ground.

According to the invention, the shielding assembly further comprises:
  at least one channel, which is arranged to keep an electrically conducting or polarizable fluid in contact with the electrical contact area when the at least one channel is filled with the fluid.

A shielding efficiency of the shielding assembly, effective for the microwave radiation which passes through the substrate between its two faces, is thus increased when the conducting or polarizable fluid contained in the at least one channel reduces an electrical impedance that exists between the electrical contact area and a point of the substrate which is at a distance from its periphery. This increase in shielding efficiency appears relative to a state of the shielding assembly where no electrical path composed at least partially by some conducting or polarizable fluid connects the point of the substrate which is inside its periphery to the electrical contact area.

In the context of this description, the electrical conduction and polarizability behaviors of the fluid, as well as the electrical impedances which are considered, relate to the frequency or to a frequency band which is between 0.1 GHz and 40 GHz, and which is targeted by the shielding assembly. In a known manner, the polarizability behavior of the fluid is quantified by its dielectric permittivity value, and high values of electrical conductivity and/or high values of dielectric permittivity correspond to low values of electrical impedance. The expression "conducting or polarizable fluid" is used throughout this description and the claims, to designate a fluid which is conducting without being polarizable, or which is polarizable without being conducting, but also a fluid which is both conducting and polarizable. Furthermore, the optical transmissions and transparencies considered, for the substrate and for a two-dimensional conducting structure possibly used, relate to the optical radiation intended to pass through the substrate.

In addition, throughout this description, the shielding efficiency, denoted EB(f) and expressed in decibels (dB), can be defined by $EB(f)=-10 \cdot \log_{10}(T(f))$, where $T(f)$ is an energy transmission coefficient of the shielding assembly for the microwave electromagnetic radiation which has a frequency f comprised between 0.1 GHz and 40 GHz, and which is intended to pass through the substrate between its two faces.

According to the invention, the shielding efficiency is varied by modifying an electrical impedance which exists between the electrical contact area and a central point of the substrate, or a point which is located close to the center of the substrate. This electrical impedance is varied using a fluid which is electrically conducting or polarizable, and a higher value of shielding efficiency is produced when the connection between the electrical contact area and the central point or the point located close to the center of the substrate presents a reduced electrical impedance value. Thus, the shielding efficiency can be varied during use of a detection system which is equipped with the shielding assembly, in real time and possibly according to the intensity level of the microwave radiation received by the detection system.

Put another way, the conducting or polarizable fluid produces a variable electrical coupling between the electrical contact area and the point which is located close to the center of the substrate. The conducting or polarizable fluid may in particular be a liquid.

A shielding assembly according to the invention may form a porthole or window suitable for closing off an opening of a shell which contains the detection system, being placed in front of an optical input of a sensor of this system which is sensitive to the optical radiation. Possibly, the shielding assembly forming a porthole or window may be suitable for also being placed simultaneously in front of an input of a sensor sensitive to part of the microwave radiation, in addition to the optical radiation sensor.

Generally, the at least one channel may be created in the substrate which is at least partially transparent to the optical radiation and to the microwave radiation. Alternatively, the at least one channel may be created in a structure which is applied against one of the faces of the substrate.

In first embodiments of the invention, the at least one channel may connect the electrical contact area to the point of the substrate which is located inside its periphery. In this case, the at least one channel may comprise a two-dimensional network of channels which extends over one of the faces of the substrate. This two-dimensional network of channels may have parallel channels, or channels arranged in a square matrix, rectangular matrix, triangular matrix, or hexagonal matrix, etc. The channels of this two-dimensional network may also be arranged without spatial periodicity, for example according to a Voronoi pattern.

In other embodiments of the invention, the shielding assembly may further comprise:
a fixed and electrically conducting two-dimensional structure, which is arranged on at least one of the faces of the substrate, which covers the point of the substrate located inside the periphery, which is electrically separated from the electrical contact area, and which is at least partially transparent to the optical radiation.

The at least one channel is then arranged so that the conducting or polarizable fluid, when it fills the at least one channel, reduces an electrical impedance which exists between the electrical contact area and the fixed and conducting two-dimensional structure. In other words, in this case the fluid produces a relay of low electrical impedance between the electrical contact area and the fixed and conducting two-dimensional structure. The at least one channel may then be limited to a portion of the substrate which is close to its periphery. For such other embodiments, the fixed and conducting two-dimensional structure may comprise a grid of a solid electrically conducting material, or a layer of a solid electrically conducting material that is transparent to the optical radiation, this grid or layer being placed on at least one of the faces of the substrate. In the case of a grid of solid electrically conducting material, this grid may have square patterns, rectangular patterns, triangular patterns, hexagonal patterns, Voronoi patterns, etc.

Possibly, in some embodiments of the invention which are said to be controlled by fluid injection, the shielding assembly may further comprise:
fluid injection means for injecting fluid into the at least one channel;
a detector for detecting an intensity of the microwave radiation, which is located close to one of the faces of the substrate; and
control means, which are arranged to trigger operation of the fluid injection means when the intensity of the microwave radiation, measured by the detector, becomes greater than a threshold.

Such shielding assembly may further comprise a quantity of the conducting or polarizable fluid, this fluid being selected among a liquid metal such as mercury, any alloy of several metals which is liquid at a temperature of use of the shielding assembly, in particular a liquid alloy based on gallium, indium and tin, a solvent which contains dissolved ions or conducting or polarizable particles in suspension, in particular salt water, an acidic solution, a basic solution. Alternatively, the fluid may also be a polarizable liquid, such as pure water, an alcohol, a ketone, or a mixture of these such as a mixture of water and ethanol in mass proportions of 50%-50%, etc.

Alternatively, other embodiments of the invention may use controlling a state transition of the conducting or polarizable fluid. In this case, the shielding assembly may further comprise a quantity of the conducting or polarizable fluid, this fluid being selected so as to exhibit a transition between two states, these states being associated with different respective electrical conductivity values of the fluid, and/or with different respective dielectric permittivity values of the fluid. The shielding assembly may then further comprise:
fluid modification means, which are suitable for changing the fluid from one of the two states to the other;
a detector for detecting an intensity of the microwave radiation, which is located close to one of the faces of the substrate; and
control means, which are arranged to trigger operation of the fluid modification means when the intensity of the microwave radiation, measured by the detector, becomes greater than a threshold.

In all these cases, the detector of the intensity of the microwave radiation and the control means can allow automatic operation of the shielding assembly in order to modify its shielding efficiency, in particular to increase it.

In particular, the fluid modification means may be heating and/or cooling means which are arranged to modify a temperature of this fluid, or means for modifying a composition of the fluid. In the case of heating and/or cooling means, both states of the fluid are distinguished by its temperature, and by the variations in its electrical conductivity and/or in its dielectric permittivity which are correlated with the variations in its temperature. It is thus possible to tweak the shielding efficiency as needed, by controlling and adjusting the temperature of the fluid. Optionally, the fluid modification means may be suitable for modifying a phase of the fluid. For example, cooling means can cause the fluid to transition from a gaseous phase to a liquid phase, or from a liquid phase to a solid phase, or heating means can cause the fluid to transition from a solid phase to a liquid phase, or from a liquid phase to a gaseous phase, when these phase changes produce appropriate changes in the electrical impedance existing between the electrical contact area and the point of the substrate which is located inside the periphery.

A second aspect of the invention provides a detection system that comprises:

an optical sensor, which is sensitive to the optical radiation;

at least a portion of an electrically conducting shell, which surrounds the optical sensor and which comprises an opening; and a shielding assembly that is in accordance with the first aspect of the invention, the substrate of this shielding assembly being arranged in front of an optical input of the optical sensor while closing off the opening in the shell portion.

The electrical contact area of the shielding assembly is then electrically connected to the shell portion.

Finally, a third aspect of the invention proposes a carrier vehicle which comprises a detection system that is in accordance with the second aspect of the invention. Such carrier vehicle may in particular be an air, land, or sea vehicle.

BRIEF DESCRIPTION OF FIGURES

The features and advantages of the invention will become more clear in the following detailed description of some non-limiting embodiments, with reference to the appended figures which include.

DETAILED DESCRIPTION OF THE INVENTION

For clarity, the dimensions of the elements shown in these figures correspond neither to actual dimensions nor to actual dimension ratios. Furthermore, identical references indicated in different figures designate elements which are identical or which have identical functions.

Figure 1:
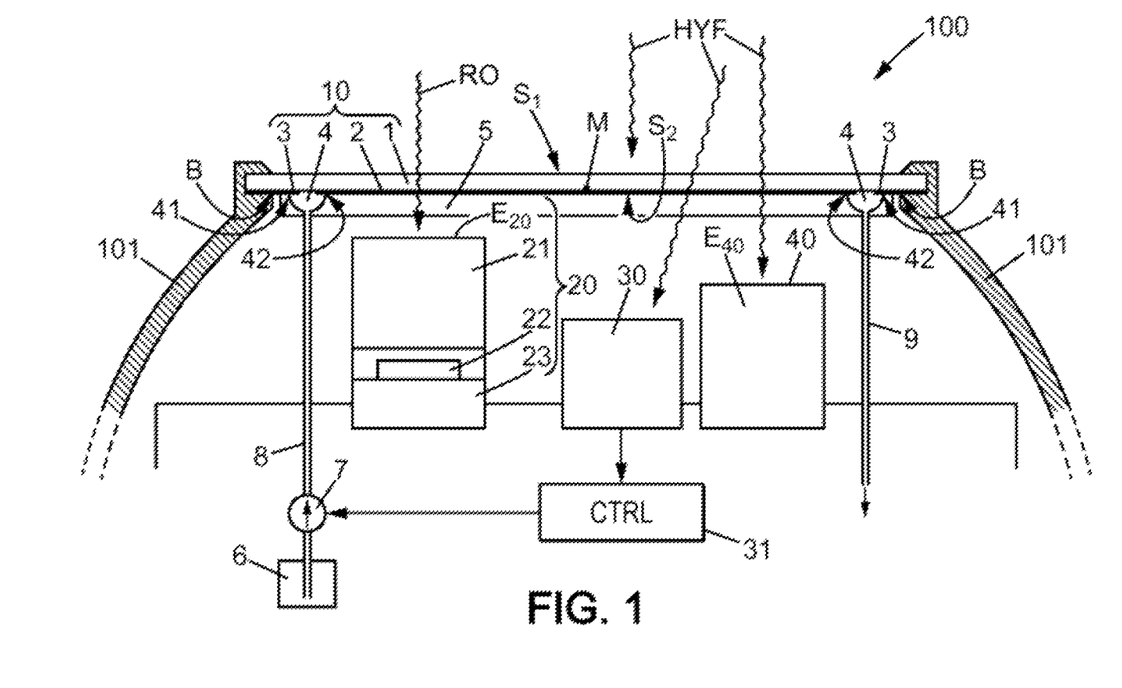
FIG. 1 represents a detection system to which the invention is applied.

In accordance with [FIG. 1], a detection system 100 comprises a shell portion 101, a shielding assembly 10, and at least one optical sensor 20. It may optionally further comprise a microwave radiation sensor 40 and a microwave radiation detector 30, these to be described later.

Figure 7:
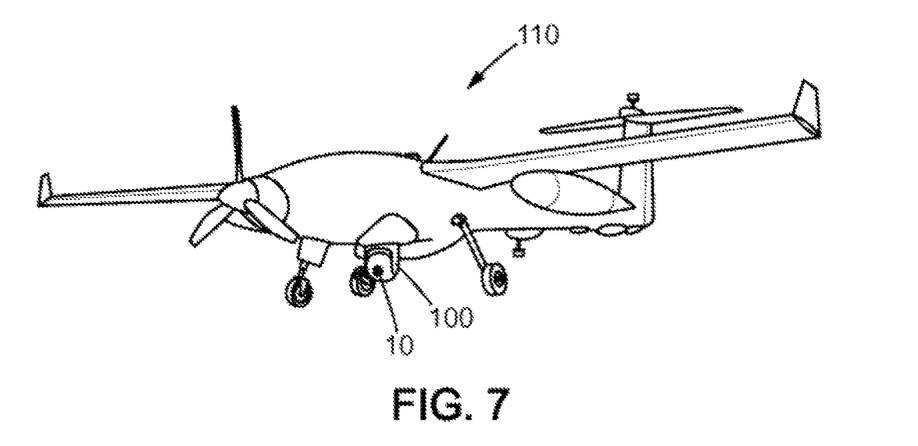
FIG. 7 shows an aerial carrier vehicle of the drone type, which is in accordance with the invention.

For example, the detection system 100 may have a mobile optronic ball configuration, and be intended to be carried onboard a carrier vehicle. Possibly, the sensors of the detection system 100, including the optical sensor 20 and also possibly the microwave radiation sensor 40, may contribute to the detection of an external scene element. [FIG. 7] shows a drone 110 which is equipped with the detection system 100.

The shell portion 101 is electrically conducting, for example composed of a metal material or a composite material based on carbon fibers. It constitutes an electrical ground which can be considered as a reference electrical potential. Furthermore, the shell portion 101 surrounds the optical sensor 20, together with the microwave radiation sensor 40 and/or the microwave radiation detector 30 where appropriate, forming a cavity in which the sensor(s) and/or detector are located. Thus, the shell portion 101, aside from the shielding assembly 10, constitutes an opaque screen for microwave radiation coming from outside.

The optical sensor 20 is sensitive to optical radiation RO in the wavelength band which is between 0.1 µm and 15 µm. It may be an image sensor, which in a known manner comprises a lens 21, an image detector 22, for example of the image sensor matrix type, and proximity electronics 23. The proximity electronics 23 are intended in particular to control the operation of the image detector 22, and to transmit image readout signals which are delivered by said detector, to a remote processing unit (not shown). The operation of the proximity electronics 23 may be disrupted by microwave radiation HYF, in the frequency band of between 0.1 GHz and 40 GHz, which would penetrate the shell portion 101. Indeed, the optical input $E_{20}$ of the optical sensor 20 is necessarily exposed to the outside in order to collect the optical radiation RO originating from the scene element, but this exposure also applies to the microwave radiation HYF, which can disrupt the operation of the detection system 100, including when the microwave radiation HYF is not originating from the scene element which is targeted.

To avoid the effects of such disruptions, in particular on the proximity electronics 23, the shielding assembly 10 is designed to be at least partially opaque to the microwave radiation HYF, while being at least partially transparent to the optical radiation RO. However, a shielding efficiency for the shielding assembly 10 that is too high may not be desired during a certain phase in the use of the detection system 100. For this reason, the invention proposes an improvement of the shielding assembly 10 which makes it possible to modify its shielding efficiency, for example automatically during use of the detection system 100. Such automatic modification of the shielding efficiency of the assembly 10, in real time during its use, can be useful in particular when the detection system 100 comprises the microwave radiation sensor 40, which requires receiving a sufficient portion of the microwave radiation HYF in order to operate, but without causing saturation or degradation by overexposure. In one possible context of use, the intensity of the microwave radiation HYF may be low during a first phase of use, so that low shielding efficiency is then desired, to allow proper operation of the sensor 40. Such low shielding efficiency can also prevent the microwave radiation produced by the detection system 100 itself from remaining concentrated on this detection system, to the point of risking interference with its operation. Then, during a subsequent phase of use, the intensity of the microwave radiation HYF may become too great, so that increased shielding efficiency is then required. But the shielding assembly 10 must remain sufficiently transparent to the optical radiation RO during both phases of use, in order to allow the optical sensor 20 to operate correctly.

The shielding assembly 10 may form a window for closing off the shell portion 101, which is arranged in front of the optical input $E_{20}$ of the optical sensor 20, and possibly also in front of the radiation input $E_{40}$ of the microwave radiation sensor 40, and possibly also in front of the microwave radiation detector 30.

The shielding assembly 10 comprises a substrate 1 which is transparent to the optical radiation RO and to the microwave radiation HYF, between two opposite faces of substrate 1 which are denoted $S_1$ and $S_2$. Such substrate may be based on silicon (Si), germanium (Ge), gallium arsenide (GaAs), zinc sulfide (ZnS), silica (SiO$_2$), aluminum oxide (Al$_2$O$_3$) or magnesium oxide (MgO), etc., in a non-limiting manner. When the substrate 1 has a circular geometry, its diameter may be between 5 cm (centimeter) and 50 cm, for example.

It is specified that, in general for the invention, the assembly 10 is not limited to a circular geometry, but alternatively it may have a square, rectangular, elliptical geometry, etc. without limitation to its shape. When this geometry is circular, the periphery of the substrate 1 denotes its circumference.

Figure 3:
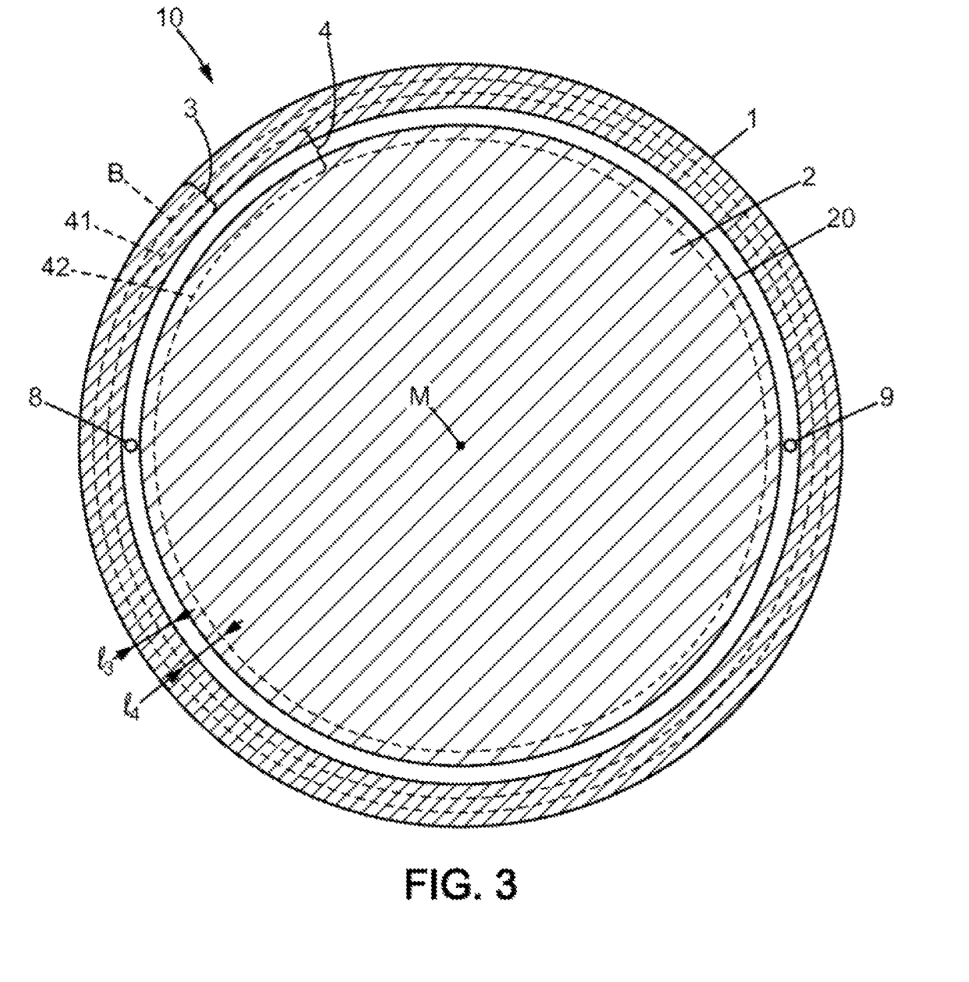
FIG. 3 is a plan view of a window that may be part of a shielding assembly according to the invention.
Figure 4:
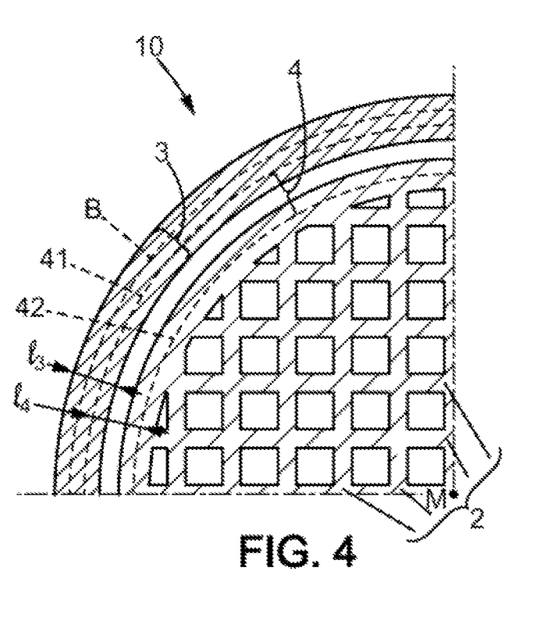
FIG. 4 is a plan view of a first variant embodiment of the window of [FIG. 3]

In the embodiments illustrated by [FIG. 1]-[FIG. 4], the substrate 1 carries on at least one of its faces $S_1$ and $S_2$, for example the face $S_2$, a two-dimensional structure 2 which is electrically conducting and fixed, for producing the electromagnetic shielding efficiency. The two-dimensional structure 2 is designed to be transparent to the optical radiation RO, and to be electrically conducting to an extent which is adapted to produce a shielding effect against the microwave radiation HYF. To achieve this, the two-dimensional structure 2 may have one of the following configurations, which are cited as non-limiting examples:

- at least one thin layer of a metal, for example a layer of silver (Ag), which may be interposed between two dielectric layers transparent to the optical radiation RO, both dielectric layers having the purpose of reducing the reflection of the optical radiation RO in comparison to the metal layer alone;
- at least one layer of a transparent and conducting oxide, for example a layer of indium oxide doped with tin (ITO), optionally associated with at least one other dielectric layer transparent to the radiation RO, again having the purpose of reducing the reflection of the optical radiation RO in comparison to the conducting transparent oxide layer alone;
- a grid of an electrically conducting material, for example a copper (Cu) or silver (Ag) grid, which is composed of printed strips or of wires of conducting material, and the substrate 1 being devoid of electrically conducting material between the strips or wires of the grid. Optionally, the conducting material of the grid may be superimposed on a material for attachment to the substrate 1, and possibly further covered with a protective material, in particular for protection against corrosion, for example an overlayer of titanium (Ti). In general, the strips or wires of such grid are opaque to the optical radiation RO, and the transparency to the optical radiation RO results from the level of coverage of the substrate 1 by the strips or wires of the grid, which is limited. For example, this level of coverage may be between 10% and 50%, the spacing between strips or wires in the grid may be between 1 µm (micrometer) and 10 mm (millimeter), and the grid may have a square pattern. However, other grid patterns are also possible: rectangular, triangular, octagonal, Voronoi, etc. The grid of electrically conducting material may be associated with at least one dielectric layer transparent to the radiation RO, possibly also for the purpose of reducing the reflection of the optical radiation RO in comparison to the substrate 1 alone, but also as protection against corrosion of the metal grid.

Optionally, the two-dimensional structure 2 may also be composed of a grid whose strips or wires are each optically transparent, being based on one or more thin layer(s) of a metal which is (are) interposed between dielectric layers, or being based on a transparent and conducting oxide.

Such two-dimensional structures 2 may be created on the substrate 1 by one of the material deposition methods known to those skilled in the art, such as cathode sputtering, evaporation, chemical vapor deposition, electrolytic deposition, possibly in combination with one or more masking or etching steps.

The configurations which have just been cited for the two-dimensional structure 2 are known, so that it is not necessary to describe them further here. They may each have a resistance per square which is between $10^{-2}$ ohm per square and 20 ohm per square, for example. However, and in general for the invention, the shell portion 101 preferably has a resistance value per square which is lower than that of the two-dimensional structure 2. Thus, the function of electrical ground or electrical potential reference is produced by the shell portion 101 in a better extent with respect to the two-dimensional structure 2.

Also in a known manner, the two-dimensional structure 2 must be connected to the shell portion 101 with a low connection impedance value in order to produce efficient shielding protection. At least one electrical contact area 3 is provided on the substrate 1, at its periphery, so that it is possible to connect electrically the electrical contact area 3 to the shell portion 101, with an electrical connection resistance which is low or minimal. For example, the electrical contact area 3 may be an additional conducting two-dimensional structure portion, which is separate from the structure 2 on face $S_2$, and arranged to come into electrical contact with the shell portion 101 when the substrate 1 is assembled with this latter. Alternatively, the electrical contact area 3 may be electrically connected to the shell portion 101 during a dedicated connection operation. For example, at least one electrical terminal may be attached to the electrical contact area 3, by one of the known techniques such as surface welding or pinching using an electrically conducting contact finger. Then this electrical terminal is connected to the shell portion 101 by one of the many known methods, including plugging in or screwing an additional terminal into the shell portion 101, contact under pressure with or without elastic deformation, etc.

The shielding efficiency then depends on the low or high value of the electrical impedance of the connection between the conducting two-dimensional structure 2 and each electrical connection area 3. According to the invention, a channel 4 is provided for filling with a liquid, so that the liquid is then in contact with the conducting two-dimensional structure 2 on the one hand, and with the electrical contact area 3 on the other hand. For example, such a channel may extend continuously around the conducting two-dimensional structure 2, parallel to the periphery of the substrate 1. In the embodiment which is shown in [FIG. 1], the channel 4 is formed in a plate 5 which is applied to the face $S_2$ of the substrate 1. The plate 5 is composed of an electrically insulating and non-polarizable material, but transparent to the optical radiation RO and also transparent to the microwave radiation HYF. It may be made of polycarbonate, for example. Preferably, it can be glued to the face $S_2$ of the substrate 1 outside of the channel 4. The connection between the plate 5 and the face $S_2$ of the substrate 1 is sealed, so that the liquid remains contained in the channel 4 without leakage or infiltration between the plate 5 and the electrical contact area 3, nor between the plate 5 and the conducting two-dimensional structure 2. As shown in [FIG. 1], the electrical contact area 3 and the conducting two-dimensional structure 2 may each partially extend into the cross-section of the channel 4, while remaining at a distance from each other, so that the liquid contained in the channel 4 is in contact simultaneously with both.

Figure 2:
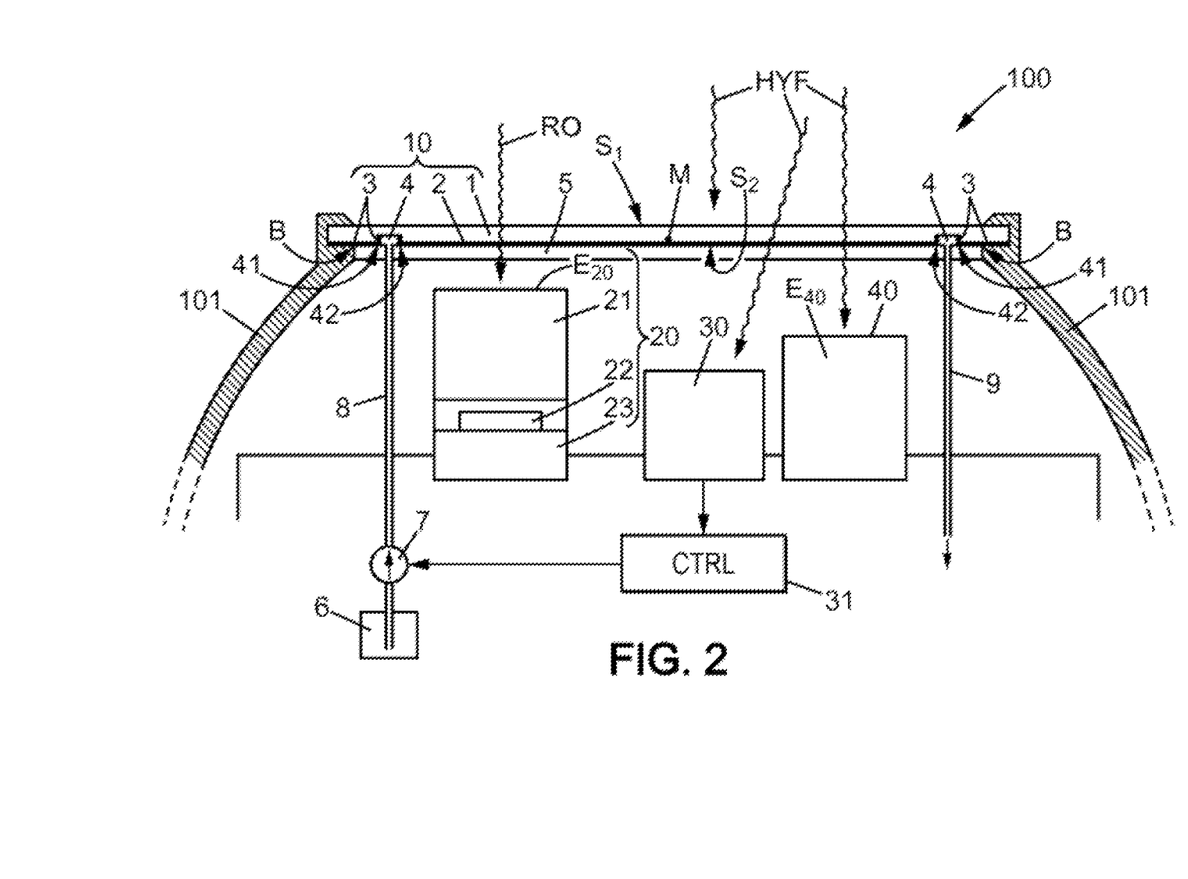
FIG. 2 shows an alternative embodiment for a shielding assembly as used in the detection system of [FIG. 1]

[FIG. 2] shows an alternative embodiment where the channel 4 is formed in the substrate 1, for example by machining, and closed off by the plate 5 which can then have a uniform thickness. The material of the plate 5 has the same properties as in the embodiment of [FIG. 1], and the plate 5 can still be glued to face $S_2$ of the substrate 1 outside of the channel 4. In the case of the embodiment of [FIG. 2], the electrical contact area 3 and the conducting two-dimensional structure 2 may each extend on opposite side walls of the channel 4, inside said channel, while the bottom of the channel 4 is electrically insulating and non-polarizable.

To achieve the low electrical impedance connection between the conducting two-dimensional structure 2 and each electrical contact terminal 3, the liquid injected into the channel 4 in order to fill it is electrically conducting or polarizable. In the case of a conducting liquid, it may be for example a liquid metal such as mercury (Hg), a solvent in which a sufficient quantity of ions has been dissolved, such as salt water, an acidic solution, a basic solution, a liquid that contains electrically conducting particles in suspension, or a liquid alloy of metals such as Galinstan®, which is based on a mixture of gallium (Ga), indium (In), and tin (Sn). In the case of a polarizable liquid, characterized by a high dielectric permittivity value, it may be for example pure water, alcohols, ketones, or mixtures of these liquids, without this list being exhaustive. For example, the liquid is initially contained in a tank 6, which is connected to at least one location of the channel 4 by a pump 7 and a fluid injection pipe 8. For the embodiment described here, the tank 6, the pump 7 and the fluid injection pipe 8 constitute the fluid injection means within the meaning of the general part of this description. Depending on the fluid that is used, the temperature of the shielding assembly 10 can be maintained within an operating range for this assembly. For example, when the fluid must be in the liquid state, a cooling system may be necessary depending on the application for the shielding assembly 10, to prevent the liquid from evaporating when the temperature of the substrate 1 exceeds the vaporization temperature of this liquid. Similarly, a heating system may be necessary to prevent the liquid from solidifying when the temperature of the substrate 1 becomes lower than the solidification temperature of the liquid. Thus, when the fluid consists of a mixture of water and ethanol in weight proportions of 50%-50%, the vaporization temperature is higher than +80° C. and the solidification temperature is lower than −40° C. These values are therefore compatible with an operating range for the shielding assembly 10 which is between −40° C. and +70° C., as for aeronautical applications of the invention. But if pure water is used as a polarizable fluid instead of this mixture, the solidification temperature which is then equal to 0° C. makes it necessary to provide a heating system for the shielding assembly 10. For other applications where the temperature of use of the shielding assembly 10 may exceed 80° C., a cooling system will be required if the mixture of water and ethanol in mass proportions of 50%-50% is used.

The channel 4 may initially be either empty of liquid or filled with an insulating, non-polarizable liquid. In other words, the channel 4 may be initially filled with a fluid having a low electrical conductivity value and a low dielectric permittivity value. In this initial state, the shielding efficiency is low, since the conducting two-dimensional structure 2 has an electrical connection impedance which is high relative to the shell portion 101. Then the conducting or polarizable liquid is injected by the pump 7 into the channel 4, producing a low value for the electrical connection impedance between the conducting two-dimensional structure 2 and the electrical contact area 3, and consequently with the shell portion 101. The shielding efficiency is thus increased compared to the initial state. The triggering of the pump 7 may be activated by an appropriate controller 31 (see [FIG. 1]), denoted CTRL, depending on the intensity level of microwave radiation HYF which can be measured by the detector 30.

In a known manner, an exhaust 9 may be provided at a location of the channel 4 which is opposite to the connection of the fluid injection pipe 8, in order to discharge an electrically insulating liquid or gas with a low dielectric permittivity value which is initially present in the channel 4, and allow its replacement by the conducting or polarizable liquid. An appropriate wetting treatment may also be applied to the walls of the channel 4, in order to facilitate injection of each liquid. Finally, the channel 4 may have a cross-section of small dimensions, so as not to reduce the opening in the shell portion 101 for the penetration of the optical radiation RO and microwave radiation HYF.

The substrate 1, the electrical contact area 3 and the channel 4 constitute the shielding assembly 10 within the meaning of this invention. In general, the injection of the conducting or polarizable liquid into the channel 4 makes it possible to produce a connection of low electrical impedance between the electrical contact area 3 and a point M which is located in a central region of the substrate 1 at a distance from its periphery and from the electrical contact area 3.

[FIG. 3] is a plan view of the shielding assembly 10 of the embodiment of [FIG. 1]. The electrical contact area 3 may be in the form of a circular strip along the periphery of the substrate 1. The width 13 of the strip may be adapted so that the electrical contact area 3 extends to either side of an edge B of the shell portion 101 which restricts the entry of radiations RO and HYF toward the sensors 20 and 40, and possibly also toward the detector 30. In the embodiment shown, the edge B of the shell portion 101, the latter being electrically conducting, is in direct contact with the electrical contact area 3. The strip width 13 is also adapted so that the electrical contact area 3 extends beyond the outer sidewall 41 of the channel 4. Moreover, the continuous conducting layer which constitutes the two-dimensional structure 2 may have a peripheral boundary 20 which is parallel to the outer sidewall 41 of the channel 4, and which projects beyond the inner sidewall 42 of the channel 4, without reaching the electrical contact area 3. For example, the channel 4 may have a width 14 of 2 mm (millimeter), whereas the electrical contact area 3 and the two-dimensional structure 2 each extend 0.5 mm inside the channel 4.

[FIG. 4] corresponds to part of [FIG. 3], when the fixed and conducting two-dimensional structure 2 consists of a grid of solid and electrically conducting material, for example a grid with a square pattern. In this case, the grid consists of conducting wires which are each parallel to one or the other of two perpendicular directions. Alternatively, but in a manner that is less preferred because of the lower values which are then obtained for the shielding efficiency, the grid of the two-dimensional conducting structure 2 may consist of wires which are parallel to a single direction, with equal distances between neighboring wires. A person skilled in the art knows how to determine, for both configurations of [FIG. 3] and [FIG. 4], the features of the conducting layer or the width of the wires and their spacing in order to obtain a desired value for the shielding efficiency. Typically, an increase in the shielding efficiency EB(f) which is greater than 10 dB has been obtained for a frequency value f equal to 10 GHz, between a first instant when the channel 4 is empty of conducting or polarizable liquid, and a second instant after the channel 4 has been filled with conducting or polarizable liquid.

Figure 5:
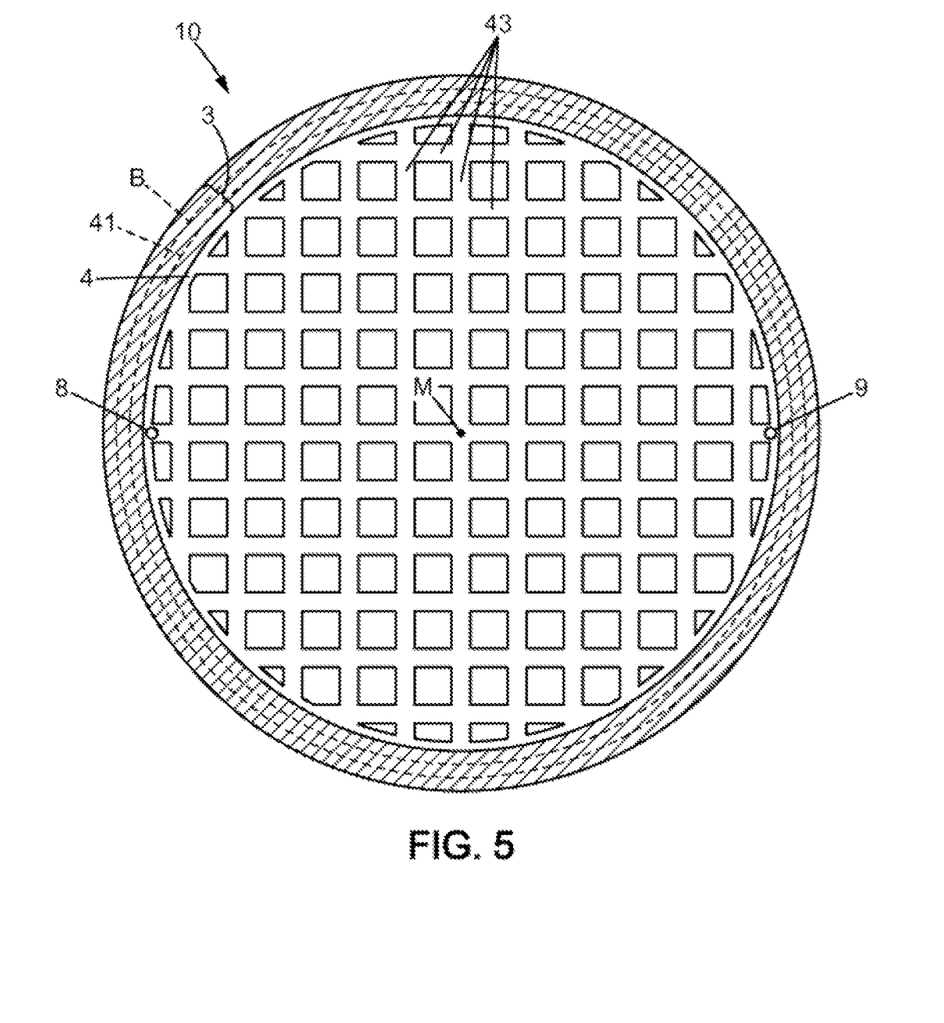
FIG. 5 is a plan view of a second variant embodiment of the window of [FIG. 3]

[FIG. 5] shows yet another embodiment of the invention, in which a two-dimensional network of channels replaces the two-dimensional structure 2 composed of solid conducting material. The two-dimensional network of channels extends from the peripheral channel 4, in the form of secondary channels 43 which may form any pattern in the face $S_2$ of the substrate 1. For example, the secondary channels 43 may each be parallel to one of two perpendicular directions, forming a square pattern. Alternatively, but in a manner which is less preferred because of the lower values which are then obtained for the shielding efficiency, the secondary channels 43 may be parallel in a single direction, with equal distances between neighboring channels. The fluid injection pipe 8 and the exhaust 9 are preferably positioned to facilitate gradual penetration of the liquid into the entire two-dimensional network of the secondary channels 43, starting from the peripheral channel 4. For such embodiment, the conducting or polarizable liquid no longer only has the role of a low electrical impedance connector, but also has the role of a material which itself produces the shielding function. To produce this function, it generates a low electrical impedance value between the electrical contact area 3 and at least one point M which is located in a central region of the substrate 1 at a distance from the electrical contact area 3. As for the peripheral channel 4, the secondary channels 43 may alternatively be formed in the plate 5 or in the substrate 1. Such embodiments of the invention in accordance with [FIG. 5] are preferably implemented with a liquid which is electrically conducting.

In variant embodiments of the invention, the fixed and conducting two-dimensional structure 2 or two-dimensional network of secondary channels 43 may be limited to a restricted region in the face $S_2$ of the substrate 1, facing the sensor(s) 20 and 40 which require protection from excessively high intensity values of the microwave radiation HYF. The conducting two-dimensional structure 2 or two-dimensional network of secondary channels 43 which is provided inside this restricted region can then be connected to the peripheral channel 4 by only a few conducting wires or secondary channels, in order to ensure that the variation in the shielding efficiency is effective for the sensor(s) to be protected. The transparency of the shielding assembly 10 to the optical radiation RO and microwave radiation HYF outside this restricted region can thus be maximized.

Conversely, in other variant embodiments of the invention, the fixed and conducting two-dimensional structure 2 as described with reference to [FIG. 3] or [FIG. 4], or the two-dimensional network of secondary channels 43 as described with reference to [FIG. 5], may be eliminated from a restricted region in the face $S_2$ of the substrate 1, which is facing a sensor that does not need to be protected from excessively high intensity values of the microwave radiation HYF. Such other variant is particularly appropriate when the operation of the sensor concerned is improved if the intensity of the optical radiation RO or microwave radiation HYF that it receives is greater.

In yet other variant embodiments of the invention, the liquid which fills the channel 4 and/or the network of secondary channels 43 may exhibit a state transition, between a first state which is electrically insulating and not polarizable, and a second state which is electrically conducting or polarizable. Thus, the first state is associated with a high electrical resistivity value at a low dielectric permittivity value, while the second state is associated with another electrical resistivity value of the liquid which is lower than that of the first state, and/or another dielectric permittivity value of the second state which is greater than that of the first state. Transition between both states can be controlled by the temperature of the liquid. The shielding assembly 10 may then further comprise liquid modification means, which are suitable for changing this liquid from the first state to the second state, or possibly the reverse. In the case of a state transition which is controlled by temperature, the substrate 1 may be provided with a heating element, for example distributed on one of its faces, such as a heating layer. In this case, the liquid may be permanently and statically contained in the channels 4 and/or 43, and the shielding efficiency is varied by triggering the supply of power to the heating element. Alternatively, the liquid may be heated outside the channels 4 and 43, by a heating element which is arranged around the fluid supply pipe 8. In this case, the exhaust 9 is connected to the inlet of pump 7 in order to establish a closed loop circulation of the liquid. For such variant embodiments of the invention where the liquid exhibits a state transition which is heat-activated, with variation of its electrical conductivity and/or of its dielectric permittivity, operation of the heating element and possibly also of the pump 7 may still be triggered by the controller 31, according to the measurement signal which is delivered by the detector 30.

Alternatively to a mode where heat is implemented to cause transition of the liquid between the first state and the second state, it is possible to control this transition by modifying the composition of the liquid. For example, the liquid may have an initial composition which is electrically insulating and non-polarizable, and the transition may be caused by injecting into this initial composition an additional composition component which is electrically conducting and/or polarizable. Preferably, this additional component is miscible with the liquid in its initial composition. Several pumps can then be used to thus vary the composition of the liquid.

Figure 6A:
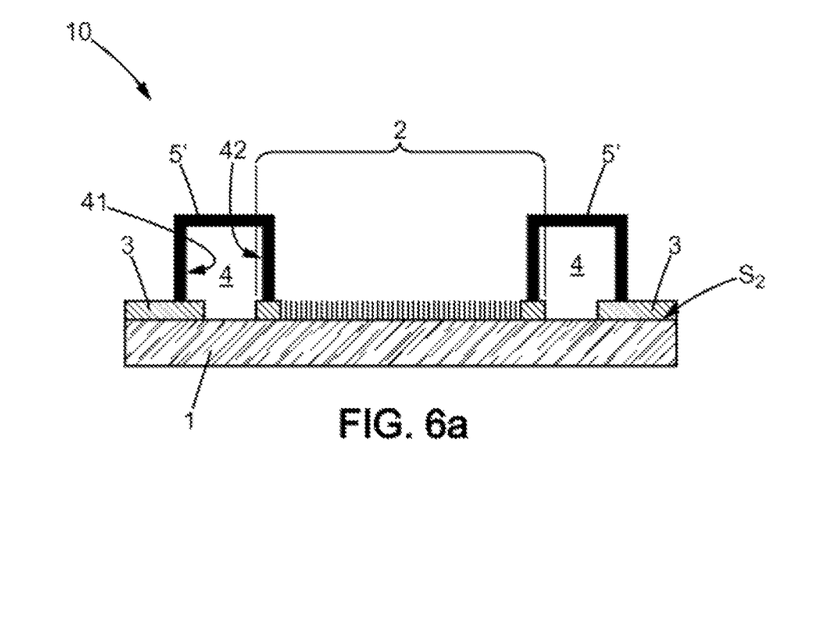
FIG. 6a is a schematic cross-sectional view of the first variant embodiment of the window of [FIG. 4]
Figure 6B:
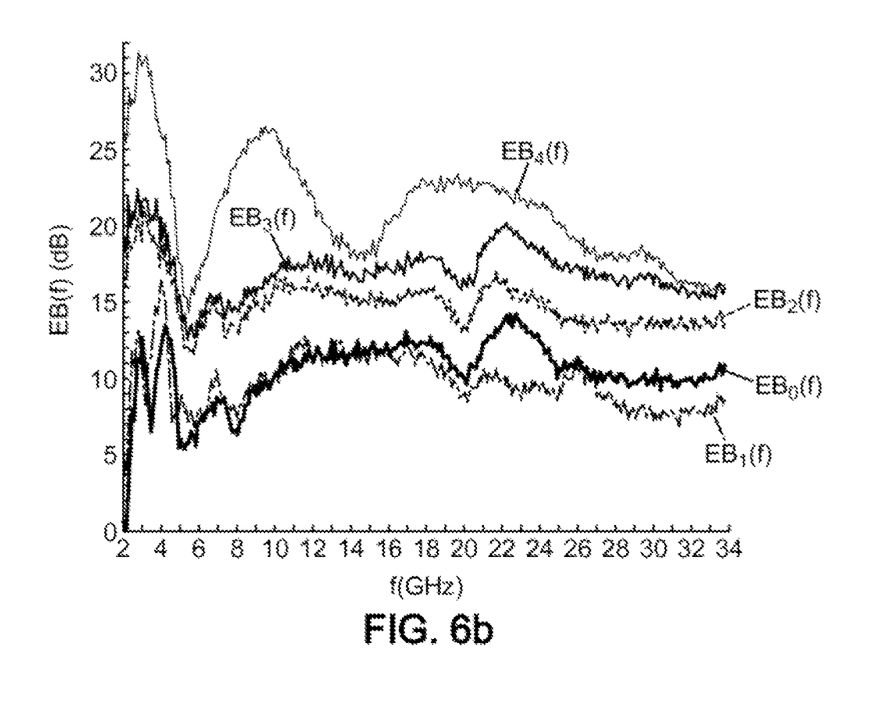
FIG. 6b is a spectral diagram of shielding efficiency for the first variant embodiment of the window of [FIG. 4], established for several polarizable fluids.

[FIG. 6a] corresponds to the embodiment of [FIG. 4] which was described above. The substrate 1 is formed by a square clear glass plate of dimensions such that the two-dimensional structure 2 occupies a square surface of approximately 50 mm×50 mm. In this embodiment, the two-dimensional structure 2 is formed by a layer of silver (Ag) which is etched to form a grid with a square pattern. The pitch of this grid, of the order of one to several micrometers, and the width of its wires, are selected so that it has an optical transmission which is between 80% and 86% over the entire wavelength range of between 0.400 µm and 1.100 µm for the optical radiation. Out of this spectral range for the optical radiation, the optical transparency of the shielding assembly 10 is determined by the glass substrate. The channel 4 is composed of a gutter 5' which is applied to the substrate 1 in a sealed manner, with an inner rim 42 of the gutter 5' being glued to the two-dimensional structure 2 at a distance from the outer peripheral boundary thereof, and an outer rim 41 of the gutter 5' being glued to the electrical contact area 3 at a distance from the inner boundary of this area. In this manner, a polarizable liquid injected into the so-formed channel 4 establishes an electrical contact with reduced impedance between the two-dimensional structure 2 and the electrical contact area 3. As an example, the gutter 5' may be created with polylactic acid by three-dimensional printing, or 3D-printing, but other gutter materials and other manufacturing technologies may alternatively be used. The diagram of [FIG. 6b] shows the shielding efficiency values EB(f) which are obtained for such shielding assembly 10, as a function of the frequency f between 2 GHz and 34 GHz, for the following conditions of use:

curve $EB_0(f)$: vacuum or dry air in the channel 4,
curve $EB_1(f)$: channel 4 filled with an organic oil having a low dielectric permittivity value,
curve $EB_2(f)$: channel 4 filled with ethanol, having an average dielectric permittivity value,
curve $EB_3(f)$: channel 4 filled with a mixture of $50\%_{vol.}$ ethanol and $50\%_{vol.}$ water, and
curve $EB_4(f)$: channel 4 filled with ultrapure water, having a dielectric permittivity value considered to be high.

These curves show that the shielding efficiency is all the higher when the medium present inside the channel 4 has a high dielectric permittivity value. Thus, ultrapure water (curve $EB_4(f)$), which has a dielectric permittivity value higher than those of the organic oil used and of ethanol, provides an average gain of more than 22 dB for the shielding efficiency at 34 GHz in comparison to a use condition of the shielding assembly 10 where the channel 4 is empty (curve $EB_0(f)$). These curves further show that it is possible to adjust the shielding efficiency to a desired level by using an appropriate liquid to fill the channel 4, this liquid possibly being a controlled mixture of several components whose respective dielectric permittivity values are different. The inventors emphasize that the invention, consisting of using a conducting or polarizable fluid to produce a connection of low electrical impedance, is effective within a spectral domain, in particular for frequency values f which are greater than 15 GHz, where the use of lumped electronic components such as PIN diodes, is becoming less and less effective in producing an electrical connection of controlled variable impedance. Furthermore, as the filling liquids for curves $EB_1(f)$ to $EB_4(f)$ are contained exclusively in the channel 4, they do not modify the optical transmission of the shielding assembly 10 compared to the case where the channel 4 is empty (curve $EB_0(f)$). The diagram of [FIG. 6b] illustrates the efficiency of using polarizable fluids in place of electrically conducting fluids in the channel 4. Additionally, many polarizable fluids are available with sufficient dielectric permittivity values, exhibiting toxicities and environmental hazards which are much less than those of most electrically conducting liquids.

It is understood that the invention may be reproduced with modifying secondary aspects of the embodiments described in detail above, while retaining at least some of the advantages cited. In particular, all numerical values that have been cited have been provided for illustrative purposes only, and may be changed according to the application considered. In particular, a shielding assembly which uses the invention may have any dimensions for the transmission window it forms for the optical radiation, the microwave radiation, or both, in particular a transmission window diameter which may be less than or greater than 50 mm.

The invention claimed is:

1. An optically transparent electromagnetic shielding assembly, comprising:
    a rigid substrate having two opposite faces, wherein the rigid substrate is at least partially transparent between the two opposite faces to at least one electromagnetic radiation of a frequency between 0.1 GHz and 40 GHz, and at least partially transparent between the two opposite faces to an optical radiation having a wavelength between 0.1 µm and 15 µm, wherein the rigid substrate is electrically insulating; and
    an electrical contact area, located close to a periphery of the rigid substrate, wherein the electrical contact area is configured to be electrically connected to a terminal of an electrical source or a terminal of an electrical ground,
    wherein the optically transparent electromagnetic shielding assembly further comprises:
    at least one channel arranged to keep an electrically conducting or polarizable fluid in contact with the electrical contact area when the at least one channel is filled with the electrically conducting or polarizable fluid so that a shielding efficiency of the optically transparent electromagnetic shielding assembly, effective for the at least one electromagnetic radiation which passes through the rigid substrate between the two opposite faces, is increased when the electrically conducting or polarizable fluid contained in the at least one channel reduces an electrical impedance that exists between the electrical contact area and a point of the rigid substrate located at a distance from the periphery of said rigid substrate, in comparison to a state of the optically transparent electromagnetic shielding assembly where no electrical path composed at least partially by the electrically conducting or polarizable fluid connects the point of the rigid substrate to the electrical contact area.

2. The optically transparent electromagnetic shielding assembly according to claim 1, wherein the at least one channel connects the electrical contact area to the point of the rigid substrate located at a distance from the periphery of the rigid substrate.

3. The optically transparent electromagnetic shielding assembly according to claim 2, wherein the at least one channel comprises a two-dimensional network of channels which extends over one of the faces of the rigid substrate.

4. The optically transparent electromagnetic shielding assembly according to claim 1, further comprising:
    a fixed and electrically conducting two-dimensional structure, arranged on at least one of the two opposite faces of the rigid substrate, wherein the fixed and electrically conducting two-dimensional structure covers the point of the rigid substrate located inside the periphery, electrically separated from the electrical contact area, and wherein the fixed and electrically conducting two-dimensional structure is at least partially transparent to the optical radiation, the at least one channel being arranged so that the fluid, when the fluid fills said at least one channel, reduces an electrical impedance which exists between the electrical contact area and the fixed and electrically conducting two-dimensional structure.

5. The optically transparent electromagnetic shielding assembly according to claim 4, wherein the fixed and electrically conducting two-dimensional structure comprises a grid of a solid electrically conducting material, or a layer of a solid electrically conducting material that is transparent to the optical radiation, said grid or layer being placed on the at least one of the two opposite faces of the rigid substrate.

6. The optically transparent electromagnetic shielding assembly according to claim 1, further comprising:
- a fluid injection means for injecting fluid into the at least one channel;
- a detector for detecting an intensity of the at least one electromagnetic radiation, which is located close to one of the two opposite faces of the rigid substrate; and
- control means, arranged to trigger operation of the fluid injection means when the intensity of the at least one electromagnetic radiation, measured by the detector, becomes greater than a threshold.

7. The optically transparent electromagnetic shielding assembly according to claim 6, further comprising a quantity of the electrically conducting or polarizable fluid, the electrically conducting or polarizable fluid being selected from a group comprising a liquid metal, an alloy of several metals liquid at a temperature of use of the optically transparent electromagnetic shielding assembly, a solvent which contains dissolved ions or conducting or polarizable particles in suspension, pure water, an acidic solution, a basic solution, an alcohol, a ketone, or a mixture of at least two among water, an acidic solution, a basic solution, an alcohol, and a ketone.

8. The optically transparent electromagnetic shielding assembly according to claim 1, further comprising a quantity of the electrically conducting or polarizable fluid, wherein the electrically conducting or polarizable fluid is configured to exhibit a transition between two states of said electrically conducting or polarizable fluid, the two states being associated with different respective electrical conductivity values of the electrically conducting or polarizable fluid, with different respective dielectric permittivity values of the electrically conducting or polarizable fluid, or a combination thereof, the optically transparent electromagnetic shielding assembly further comprising:
- a fluid modification means suitable for changing the electrically conducting or polarizable fluid from one of the two states to the other;
- a detector for detecting an intensity of the at least one electromagnetic radiation located close to one of the two opposite faces of the rigid substrate; and
- control means, arranged to trigger an operation of the fluid modification means when the intensity of the at least one electromagnetic radiation measured by the detector becomes greater than a threshold.

9. A detection system comprising:
an optical sensor sensitive to the optical radiation;
at least a portion of an electrically conducting shell configured to surround the optical sensor, wherein the portion of the electrically conducting shell comprises an opening; and
the optically transparent electromagnetic shielding assembly of claim 1, the rigid substrate of the optically transparent electromagnetic shielding assembly being arranged in front of an optical input of the optical sensor while closing off the opening in the portion of the electrically conducting shell, wherein the electrical contact area of the optically transparent electromagnetic shielding assembly is electrically connected to the portion of the electrically conducting shell.

10. A carrier vehicle, comprising the detection system according to claim 9.

* * * * *